US007865170B2

(12) United States Patent
Altizer et al.

(10) Patent No.: US 7,865,170 B2
(45) Date of Patent: Jan. 4, 2011

(54) RF RADIO AND METHOD FOR MONITORING MULTIPLE CHANNELS TO ACQUIRE WARNING ALERT DATA

(75) Inventors: Daniel T. Altizer, Carmel, IN (US); Christopher Robert Lipchik, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 307 days.

(21) Appl. No.: 12/154,358

(22) Filed: May 22, 2008

(65) Prior Publication Data
US 2008/0227418 A1 Sep. 18, 2008

Related U.S. Application Data

(63) Continuation-in-part of application No. 11/657,261, filed on Jan. 24, 2007, now Pat. No. 7,711,348.

(51) Int. Cl.
*H04M 11/04* (2006.01)
*H04K 3/00* (2006.01)
(52) U.S. Cl. .................................. 455/404.1; 455/161.1
(58) Field of Classification Search ... 455/161.1–161.3, 455/166.1–168.1, 179.1–180.1, 184.1, 188.1, 455/404.1
See application file for complete search history.

(56) References Cited

U.S. PATENT DOCUMENTS 3,488,594 A * 1/1970 Caballero, Jr. .............. 455/146
3,750,032 A * 7/1973 Andrews .................. 455/154.2
6,526,268 B1 2/2003 Marrah et al.
6,553,215 B1 * 4/2003 Chung ....................... 455/218
6,728,522 B1 4/2004 Marrah et al.
7,711,348 B2 * 5/2010 Altizer .................... 455/404.1

OTHER PUBLICATIONS

"National Weather Service Instruction 10-1712, NOAA Weather Radio All Hazards (NWR) Specific Area Message Encoding (SAME)," Department of Commerce and National Oceanic & Atmospheric Administration and National Weather Service, Feb. 17, 2006, 24 pages.

* cited by examiner

*Primary Examiner*—Lee Nguyen
(74) *Attorney, Agent, or Firm*—Jimmy L. Funke

(57) ABSTRACT

An RF radio and a method of monitoring warning alert data is provided. The RF radio includes a radio receiver for receiving broadcast radio wave signals, and a tuner adjustable for selecting radio wave signal channels within AM and FM radio bands and radio wave signal channels within a weather band. The weather band is adapted to provide warning alert data. The radio also includes a controller for controlling the tuner to select a radio wave signal channel within the AM or FM radio band. The controller controls the tuner to periodically switch to the weather band to simultaneously monitor a plurality of weather band channels during an alternate frequency update, and determines presence of warning alert data. The controller further initiates receipt of the warning alert data when such warning alert data is determined to be present.

19 Claims, 5 Drawing Sheets

RF RADIO AND METHOD FOR MONITORING MULTIPLE CHANNELS TO ACQUIRE WARNING ALERT DATA

CROSS-REFERENCE TO RELATED APPLICATION

This application is a continuation-in-part of U.S. patent application Ser. No. 11/657,261, filed on Jan. 24, 2007, now U.S. Pat. No. 7,711,348, the entire disclosure of which is hereby incorporated herein by reference.

TECHNICAL FIELD

The present invention generally relates to radio frequency (RF) radios and, more particularly, relates to a radio and method of monitoring alternate frequencies of a radio band for the presence of warning alert data.

BACKGROUND OF THE INVENTION

Audio radios generally receive and process radio frequency (RF) signals typically in the amplitude modulated (AM) or frequency modulated (FM) radio bands. FM/AM audio radios are commonly employed in various environments including on board automotive vehicles. In addition to receiving FM and AM radio bands, some vehicle radios incorporate a receiver that is further capable of receiving weather (WX) band signals. The National Oceanic and Atmospheric Administration (NOAA) broadcasts the weather band radio service in the United States. The NOAA weather band broadcast transmissions generally include seven narrow band frequency modulated channels in the very high frequency (VHF) band at frequencies ranging from 162.400 MHz to 162.550 MHz, with a 25 kHz channel separation between adjacent channels.

The NOAA weather band signals include weather and emergency alert data pertaining to local geographic regions which serves as a broadcast warning alert system. The NOAA weather band broadcast includes specific area message encoding (SAME) transmitting a coded message using audio frequency shift keying (AFSK). The SAME message provides digital information indicative of the geographic region covered by the accompanying message and the warning alert data. The warning alert data includes warning alerts related to weather such as warnings or watches for tornadoes, tsunamis, hurricanes, winter storms, flood warnings, and other weather related events. Additionally, the weather alert data includes non-weather related events, such as child abduction emergency warnings, civil danger warnings, civil emergency messages, earthquake warnings, evacuation warnings, fire warnings, amongst other non-weather related warnings.

With the conventional AM/FM/WX band radio, a user may select one frequency at a time from one of the available radio bands. If a user would like to acquire the weather band signal and its warning alert data, the user is typically required to select the weather band by activating a switch which tunes the tuner to the weather band. Once the weather and warning alert data information is no longer desired, the user must select the AM or FM band to return to the original radio band station.

The radio data system (RDS) in Europe broadcasts the identical information on multiple frequencies such that the same radio content can be provided in a vehicle as the vehicle travels from one broadcast frequency region to a different broadcast frequency region. In doing so, the RDS employs an alternate frequency (AF) update to periodically look for better quality alternate frequency broadcast signals. The radio stations generally are linked by the RDS data, which identifies each station as being on the network and contains a list of the alternate frequencies on the network. As the vehicle travels, the radio automatically monitors the signals at the alternate frequencies and decides if it should switch to a station providing a better quality signal in the list of alternate frequencies. In a receiver having a single tuner, the radio monitors the stations in the list of alternate frequencies by quickly tuning from the current station to another station in the list of alternate frequencies and then back to the original station. During the quick tuning to the alternate frequency, the radio collects statistics, which generally determine the signal quality of the alternate frequency station. While the RDS configured receiver is able to monitor other stations, particularly with a single tuner, it does so in order to provide the same identical program information.

It is therefore desirable to provide for a cost affordable radio and method of monitoring data in an alternate band, such as the weather band, for providing warning alert data in a manner that does not require multiple tuners. In particular, it is desirable to provide for such a radio and method for use in a vehicle to monitor the warning alert data made available on the weather band in a way that does not interfere with the current radio station programming.

SUMMARY OF THE INVENTION

In accordance with the teachings of the present invention, an RF radio and a method of monitoring warning alert data is provided. According to one aspect of the present invention, an RF radio is provided having a radio band configured to receive warning alert data. The radio includes a radio receiver for receiving broadcast radio wave signals, and a tuner adjustable for selecting radio wave signal channels within a first radio band and radio wave signal channels within a second radio band. The second radio band comprises a plurality of channels adapted to provide warning alert data. The radio also includes a controller for controlling the tuner to select a radio wave signal channel within the first radio band. The controller controls the tuner to periodically switch to the second radio band to simultaneously monitor the plurality of channels in the second radio band and determine presence of warning alert data on one or more of the plurality of channels. The controller further initiates receipt of the warning alert data when such warning alert data is determined to be present.

According to another aspect of the present invention, a method of monitoring warning alert data broadcast in a radio band of an RF radio is provided. The method includes the steps of receiving broadcast radio wave signals with a radio receiver, and selecting a radio wave signal channel within a first radio band with a tuner. The method also includes the steps of periodically switching the tuner to a second radio band, simultaneously monitoring the plurality of channels in the second radio band, and detecting the presence of warning alert data in one or more of the plurality of channels in the second radio band. The method further includes the step of initiating receipt of the warning alert data when such warning alert data is detected.

Accordingly, the radio and method of the present invention periodically monitors multiple channels in an alternate radio band, such as the weather radio band, at the same time and determines the presence of warning alert data made available during an alternate frequency update. By employing the radio and method of the present invention, the monitored warning alert data can effectively be presented to a user in a cost-effective and timely manner with little or no interference to reception of the radio wave signals in the first radio band.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
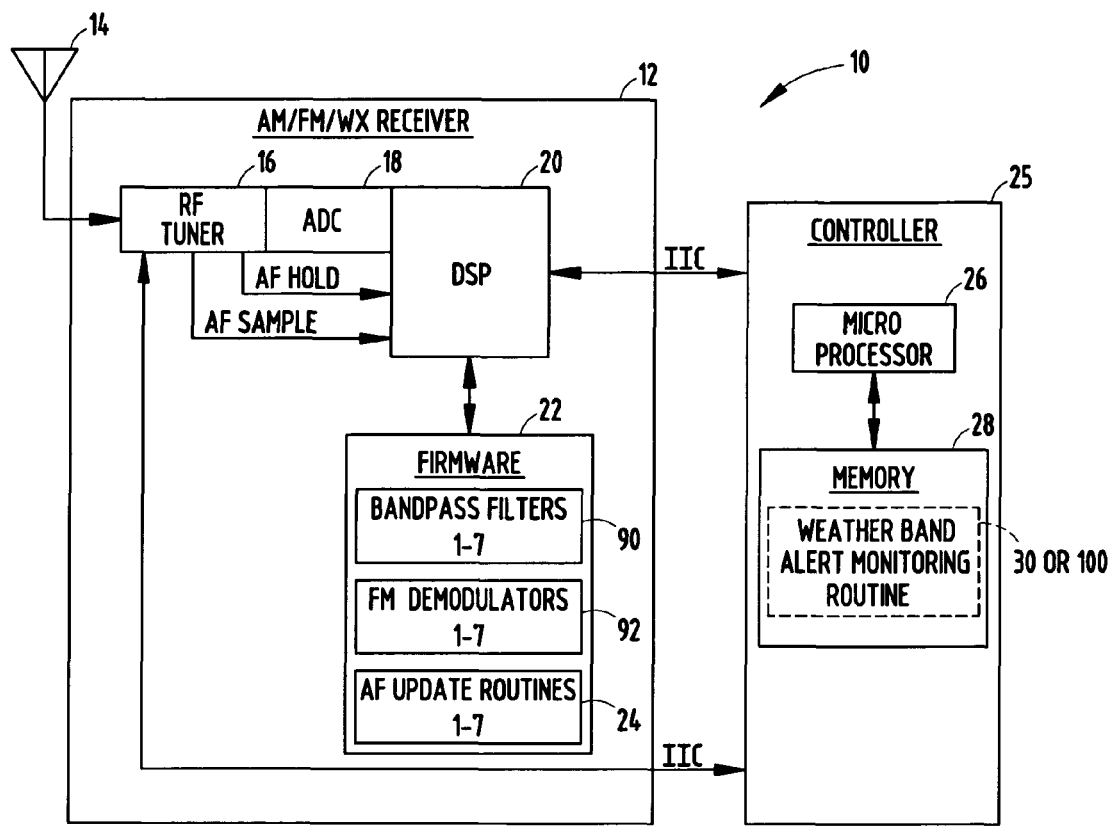
FIG. 1 is a block diagram illustrating a radio adapted to monitor warning alert data according to one embodiment of the present invention.

Referring now to FIG. 1, an RF radio 10 is generally illustrated for receiving and processing RF audio signals in any of the AM, FM and weather (WX) bands. The RF radio 10 includes an antenna 14, an AM/FM/WX receiver 12 and a controller 25, according to the embodiment shown. The antenna 14 may include one or more antennas for receiving AM, FM and weather band frequencies as is generally known in the art. According to one example, the RF radio 10 may be employed on board a vehicle in a mobile environment. It should further be appreciated that the radio 10 provides output signals to one or more audio speakers which broadcast audio sound. Output signals may also be provided to a display or other human machine interface device for presenting data.

In the disclosed embodiment, the receiver 12 is an AM, FM, weather band receiver generally capable of receiving and processing radio frequency signals in all three radio bands. Within the AM band, the receiver 12 may tune to any of a number of available AM frequencies and process the audio data made available at the tuned frequency. Similarly, the receiver 12 may tune to and process signals at any select frequency within the FM radio band. Further, receiver 12 may tune to and process RF signals broadcast in the weather band, which may include weather information and warning alert data.

Included in the radio receiver 12 is an RF tuner 16 which is coupled to the antenna 14 for receiving signals received on antenna 14. The RF tuner 16 may be included in the receiver 12 as shown or may be separate therefrom. The RF tuner 16 is adjustable to select and tune to a selected frequency within a selected radio band. The tuner 16 provides an output signal to an analog-to-digital converter (ADC) 18 which converts the analog selected frequency signal to a digital signal. A digital signal processor (DSP) 20 is coupled to the ADC 18 for processing the digital signal. The DSP 20 is coupled to memory, such as firmware 22. In one embodiment, the receiver 12 also includes seven bandpass filters 90, labeled bandpass 1-7, and seven corresponding FM demodulators 92, labeled demodulators 1-7. In the embodiment shown, the bandpass filters 90 and FM demodulators 92 are stored in firmware and executed by DSP 20. Also stored in firmware 22 and processed by DSP 20 are seven alternate frequency (AF) update routines 24, labeled AF updates 1-7. It should be appreciated that a plurality of bandpass filters 90, FM demodulators 92, and AF update routines 24 are provided for monitoring a plurality of channels in the weather band to determine the presence of warning alert data on one or more of the channels. In the exemplary embodiment shown, the weather band has seven distinct channels, and seven bandpass filters 90, seven demodulators 92, and seven AF update routines 24 are employed to simultaneously process signals at the corresponding channels. In one embodiment, the AF update routine 24 periodically monitors an alternate frequency in a different or alternative radio band, such as the weather band, and determines presence of warning alert data at the alternate frequency. In one embodiment, the AF update routine 24 may be repeated to look for warning alert data at other alternate frequencies in the alternate radio band. According to another embodiment, a plurality of AF update routines 24 are simultaneously executed to monitor alternate frequencies in the weather band to determine presence of warning alert data at the alternate frequencies.

The RF radio 10 further includes a controller 25 which includes a microprocessor 26 and memory 28. The controller 25 may be separate from the receiver 12 as shown in FIG. 1 or may be integrated therewith. Stored within memory 28 and executed by microprocessor 26 is a weather band alert monitoring routine 30, according to one embodiment, or routine 100 according to another embodiment. The controller 25 is generally coupled to the DSP 20 and the RF tuner 16 by way of a communication bus, shown as the inter-IC (IIC) communication bus. The microprocessor 26 generally controls various radio functions including mode changing amongst the AM, FM and weather radio bands, as well as tuning, seek and scan functions, in addition to other possible functions. When the microprocessor 26 initiates a tune, a seek, a scan or other function, it sends a command to the tuner 16, which activates a state machine, according to one embodiment. The state machine of the tuner 16 informs the DSP 20 of the state of the RF tuner 16 during the tune, seek, scan or other initiated function via the AF sample and AF hold flags. The AF sample and AF hold flags are binary flags, whose state and timing inform the DSP 20 as to the current state of the tuner 16 and which state the DSP 20 should have.

The RF tuner 16 is adjustable via a user, and is automatically adjustable via the DSP 20 and microprocessor 26 to tune one at a time to a plurality of available AM, FM or weather band channels at select frequencies in multiple radio bands for receiving RF signals. In the AM band mode, the RF tuner 16 tunes to a channel at a frequency in the AM band which generally includes frequencies ranging from 530 kHz to 1,710 kHz, with 10 kHz spacings in the United States. In the FM band mode, the RF tuner 16 tunes to a channel at a frequency within the FM frequency band which generally includes frequencies ranging from 87.9 MHz to 107.9 MHz, with 0.2 MHz channel spacing in the United States. The AM and FM radio bands generally provide audio radio signals.

In the weather band mode, the RF signals may contain weather, emergency and other warning alert data. NOAA weather radio service currently transmits seven weather band channels in the very high frequency range of 162.400 MHz to 162.550 MHz, having a 25 kHz (0.025 MHz) spacing between adjacent channels. In the weather band, the RF tuner 16 can be adjusted to tune to any one of the seven frequencies (channels) that are made available. The NOAA weather radio service currently transmits weather and warning alert data on the weather band, and provides for an emergency alert system in which weather and weather alert data are broadcast, as part of the specific area message encoding (SAME) message. The SAME message includes one or more geographic identifiers, generally in the form of alphanumeric codes, which define the geographical counties to which the weather or warning alert data pertains. Currently, each geographic identified code corresponds to a unique county, however, other geographic boundaries may be defined and assigned a unique code. The SAME area message generally uses audio frequency shift keying (AFSK) to generate digital data. In this system, logic zero typically is 1562.5 Hz and logic one typically is 2083.3 Hz, with a 520.8 bits per second data rate. The transmitted data generally includes the disseminating authority, the type of warning alert, the locations of the affected areas, and the start and duration of the warning alert.

The warning alert data made available on the weather band may include weather related warning events and non-weather related warning events. Examples of warning alert data for weather related events include the following: blizzard warning; coastal flood watch or warning; dust storm warning; flash flood watch, warning or statement; flood watch, warning or statement; high wind watch or warning; hurricane watch, warning or statement; severe thunderstorm watch, warning or statement; special marine warning; special weather statement; tornado watch or warning; tropical storm watch or warning; tsunami watch or warning; and winter storm watch or warning. Examples of warning alert data for non-weather related events include the following: administrative messages; avalanche watch or warnings; a child abduction emergency; civil danger warning; civil emergency message; earthquake warning; evacuation immediate; fire warning; hazardous materials warning; law enforcement warning; local area emergency; 911 telephone outage emergency; nuclear power plant warning; radiological hazard warning; shelter in place warning; and volcano warning. It should further be appreciated that the warning alert data may include other warnings such as Homeland Security warnings, emergency action notification and termination signals; national information center information, and national periodic testing, including monthly and weekly testing signals.

A description of one example of the specific area message encoding and listing of the available warning alert data provided by the NOAA weather radio service is disclosed in the published report entitled "NOAA WEATHER RADIO ALL HAZARDS (NWR) SPECIFIC AREA MESSAGE ENCODING (SAME)," National Weather Service Instruction 10-1712, dated Feb. 17, 2006, which is hereby incorporated herein by reference.

It should be appreciated that the alternate frequency may include the weather band frequency that is relevant to the geographic location of the radio, according to one embodiment. According to other embodiments, the alternate frequency may check more than one frequency and up to all seven frequencies broadcast on the weather radio band.

Figure 2:
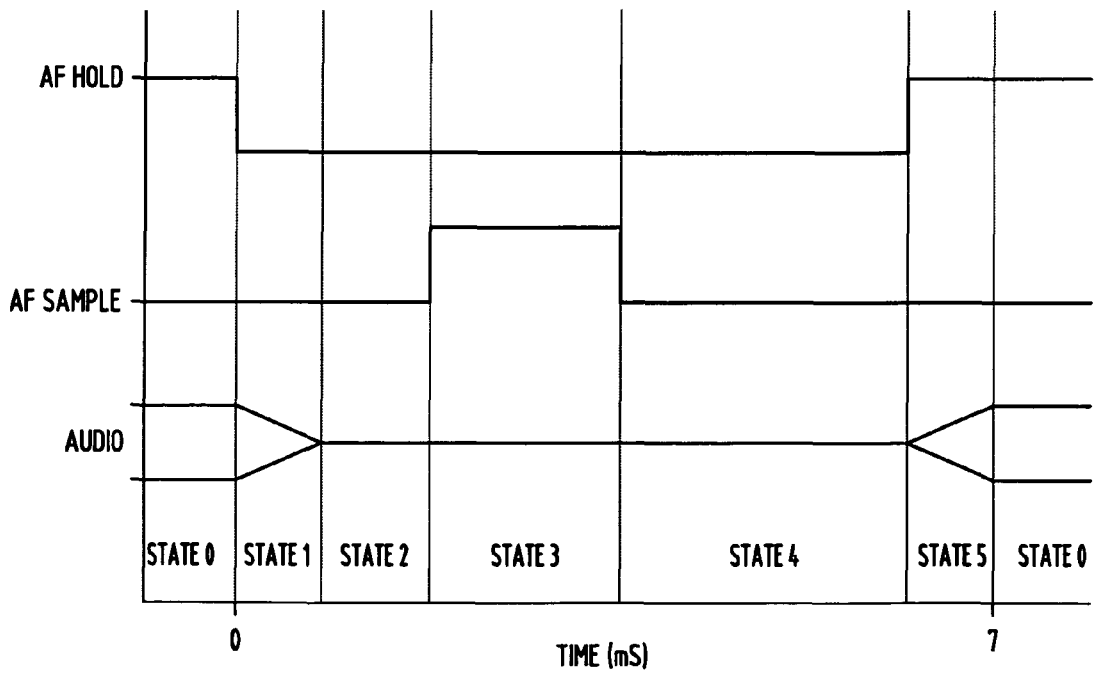
FIG. 2 is a timing diagram illustrating an alternate frequency (AF) update used to monitor warning alert data at alternate frequencies, according to one embodiment.

Referring to FIG. 2, various signal states are illustrated during an alternate frequency (AF) update in the timing diagram, according to one embodiment. As seen, the AF update occurs during states zero through five (0-5) and returns to state zero (0) following the AF update. After receiving an AF update command from the microprocessor 26, the state machine in the RF tuner 16 goes from state zero (0), which is the normal state, to state one (1), which instructs the DSP 20 to mute the audio received in the first radio band (e.g., frequency X in FM band). During state two (2), the tuner 16 tunes to one or multiple alternate frequency (AF) stations in a second radio band, such as the weather radio band. During state three (3), the tuner 16 is tuned to an alternate frequency in the weather band and the DSP 20 collects the audio signal and other signal quality information for approximately two milliseconds. During state four (4), the tuner 16 tunes back to the original station at frequency X in the first radio band (e.g., FM band) and the DSP 20 stops collecting the audio signal and its signal quality information and stores the audio signal and its signal quality information from the alternate frequency in memory. In state five (5), the radio is unmuted to again allow output of audio before returning to the normal state zero. According to one embodiment, the AF update process performed by each AF update routine according to the timing diagram illustrated in FIG. 2 may be executed in less than ten milliseconds, and may occur in approximately five to seven milliseconds, which essentially does not interfere with the receipt and processing of radio signals in the first radio band.

The RF radio 10 essentially utilizes the AF update routines 24 during an AF update to determine when the SAME data in the weather radio band is being transmitted, such that the presence of warning alert data can be determined. When the RF radio 10 is tuned to either the AM or FM radio bands, the radio performs the AF update on the weather band to check one or more of the weather band frequencies periodically and determines the presence of warning alert data. During state three (3) of the AF update, the DSP 20 collects approximately two milliseconds of the audio signal from the weather band. The radio 10 then determines if the weather band station is transmitting warning alert data in a SAME message by performing a correlation of the audio signal to the two AFSK synthesized tones, which are utilized in the SAME signal broadcast.

Figure 3:
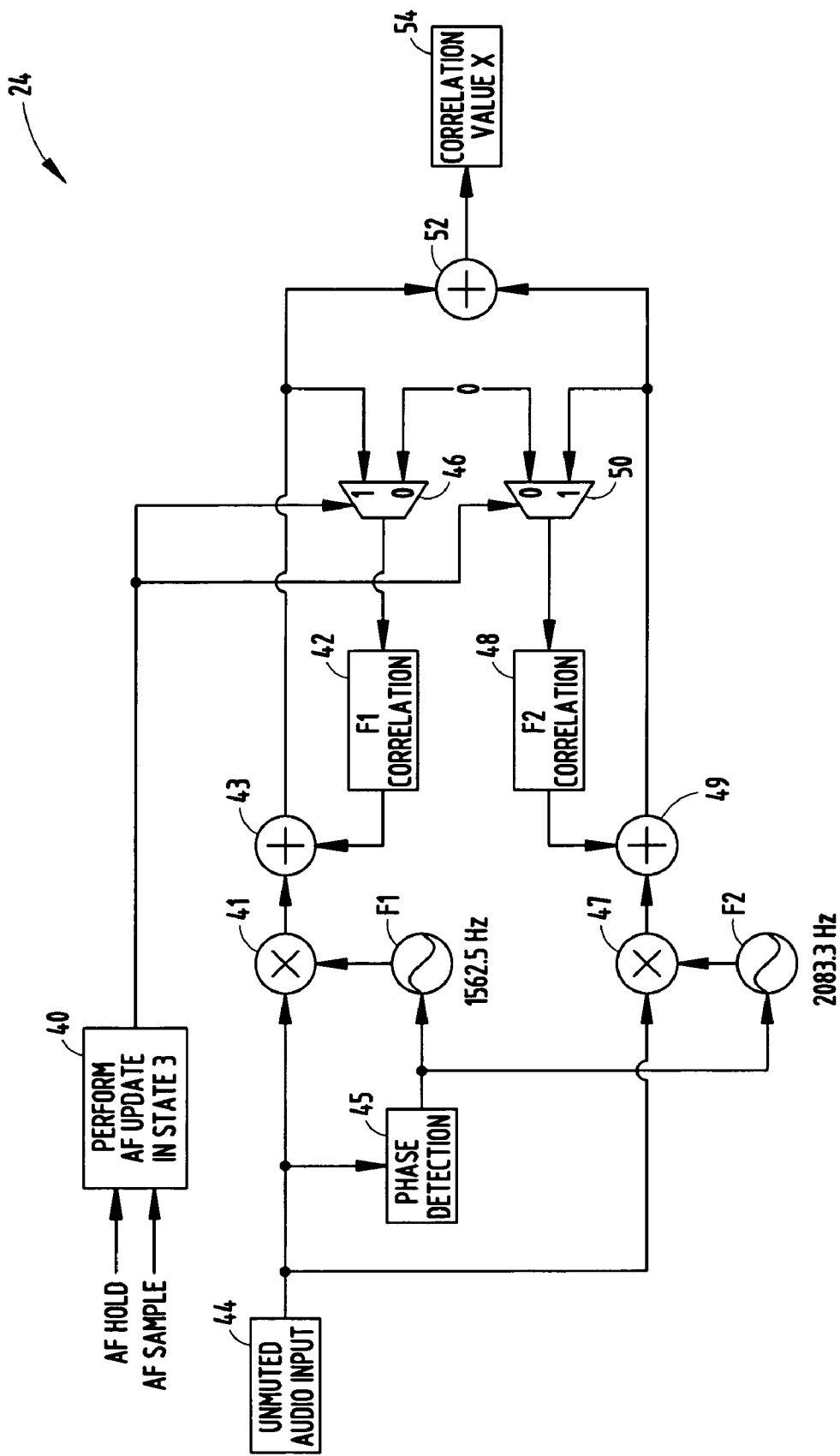
FIG. 3 is a flow diagram illustrating the alternate frequency update routine, according to one embodiment.

Referring to FIG. 3, an exemplary embodiment of an AF update routine 24 is generally illustrated receiving from the tuner the AF hold and AF sample flags to determine if the state machine is in state 3 of the AF update as seen in step 40. If the state machine is in state 3, then an enable signal is set high, which starts a correlation algorithm that attempts to determine if either AFSK tone or a combination of both AFSK tones are present in the audio which is indicative of alert data being transmitted. In this state, the audio input is unmuted as shown by step 44. The correlation algorithm is performed which processes the AFSK synthesized tone at the 1562.5 Hz signal generated by oscillator F1. Similarly, the correlation algorithm is also executed in accordance with the AFSK synthesized tone at the 2083.3 Hz signal generated by oscillator F2.

The correlation algorithm will now be described in more detail. The correlation algorithm attempts to determine if either AFSK synthesized tone or a combination of both AFSK synthesized tones are present in the audio for the two millisecond window in state three (3) of the AF update process. In the one path, referred to as the F1 path, the correlation algorithm includes a multiplier 41 that multiplies the audio signal as an input with the frequency F1 of 1562.5 Hz. In the AFSK coded message, the frequency 1562.5 Hz represents logic zero. The product output from multiplier 41 is integrated for the duration of state three, which is indicated by the enable input. The integration is provided by summer 43, F1 correlation block 42 and integrator 46. Integrator 46 integrates the output in the F1 path via integrator 46 and provides the integrated output as a feedback signal to the F1 correlation block 42 which is then summed with the output of multiplier 41. The output of summer 43 is then provided as an input to summer 52.

The correlation algorithm performs a similar correlation in a second path, referred to as the F2 path, which includes a multiplier 47 for multiplying the audio signal by the second frequency of 2083.3 Hz. In the AFSK coded message, the frequency 2083.3 Hz represents logic one. The product output from multiplier 47 is integrated for the duration of state three (3), which is indicated by the enable input. The integration performed in the F2 path includes integrator 50, F2 correlation block 48, and summer 49. The signal in the F2 path is integrated by integrator 50, which is provided to F2 correlation block 48, and the output thereof is summed with the output of multiplier 47 via summer 49. The output of summer 49 is then provided as an input to summer 52.

The correlation values generated in the F1 and F2 paths are summed by step 52 to arrive at the summed correlation value 54 for each channel. The summed correlation value 54 is compared to a correlation threshold in the weather band alert module by routine 30 shown in FIG. 4 or routine 100 shown in FIG. 6 as described herein to determine the presence of warning alert data.

The correlation algorithm is shown including a phase detection block 45 that receives the audio signal and provides phase detection output signals to frequency oscillators F1 and F2. The purpose of phase detection block 45 is to adjust the phase of the F1 oscillator to match the phase of the audio input. If the audio input consists entirely of the F1 tone, but is exactly ninety degrees out of phase from the F1 oscillator, then the correlation value will be zero. To avoid this problem, the phase of the F1 oscillator is adjusted to match the phase of the incoming audio signal, so that the maximum correlation value can be achieved. Similarly, the phase detection block 45 adjusts the phase of the F2 oscillator to match the phase of the incoming audio signal, so that the maximum correlation value can be achieved.

Figure 4:
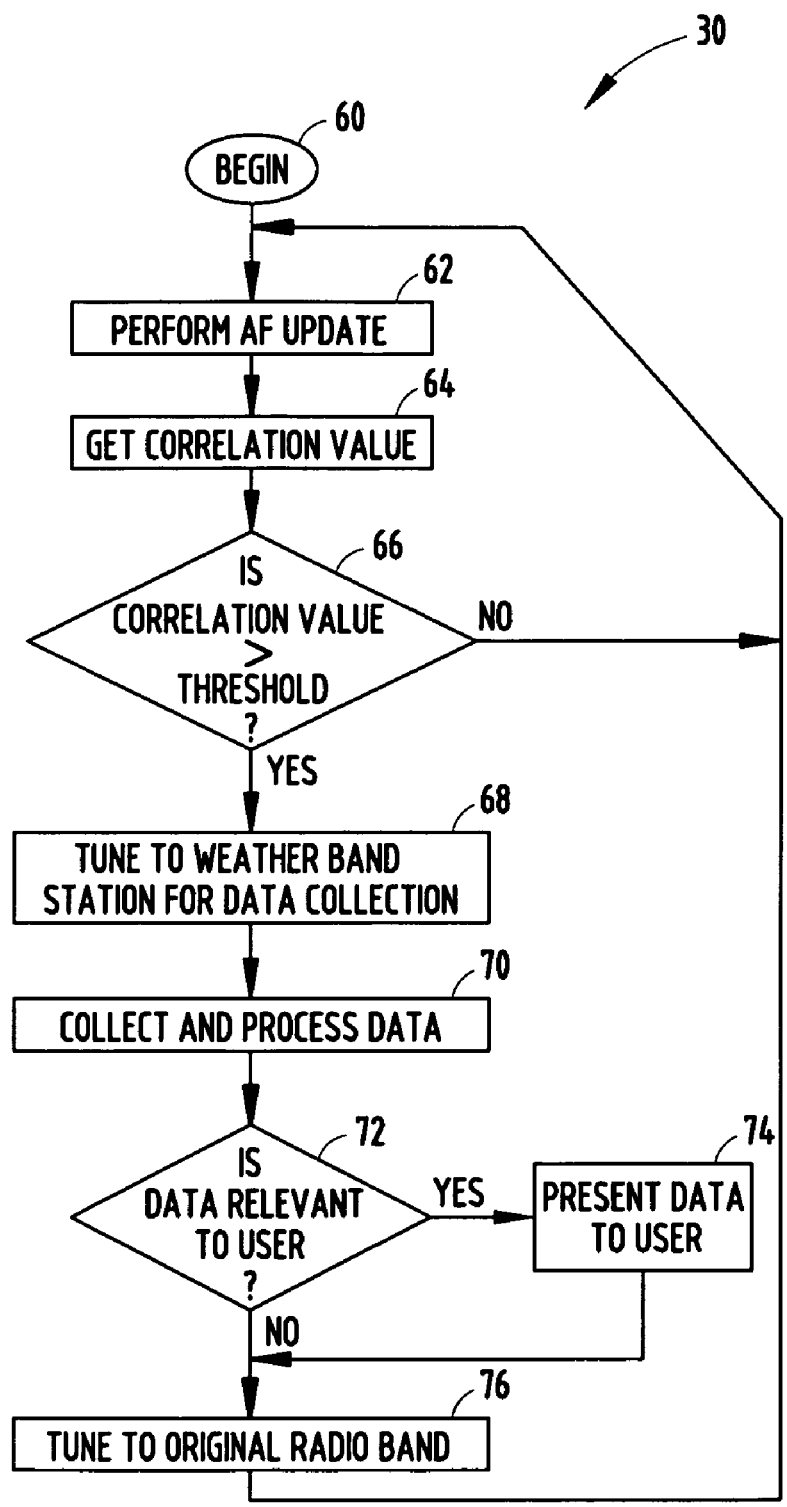
FIG. 4 is a flow diagram illustrating a weather band alert monitoring routine, according to one embodiment.

Referring to FIG. 4, the weather band alert monitoring routine 30 is illustrated, according to one embodiment. Routine 30 begins at step 60 and proceeds to perform an AF update in step 62. The AF update includes performing the AF update routine 24 to provide for a correlation value which, according to one embodiment, is generally indicative of the signal quality of the data. Next, in step 64, the correlation value is obtained. In decision step 66, routine 30 determines if the correlation value is greater than a threshold and, if not, returns to step 62. If the correlation value is determined to be greater than the threshold, routine 30 proceeds to tune to the channel in the weather band to collect data, which includes the warning alert data. Next, in step 70, the warning alert data is collected and processed. In decision step 72, routine 30 determines if the warning alert data is relevant to the user and, if not, tunes to the original radio band in step 76 before returning to step 62. If the warning alert data is determined to be relevant to the user, routine 30 presents the data to the user or otherwise processes the data in step 74 and then tunes to the original radio band in step 76.

Figure 5:
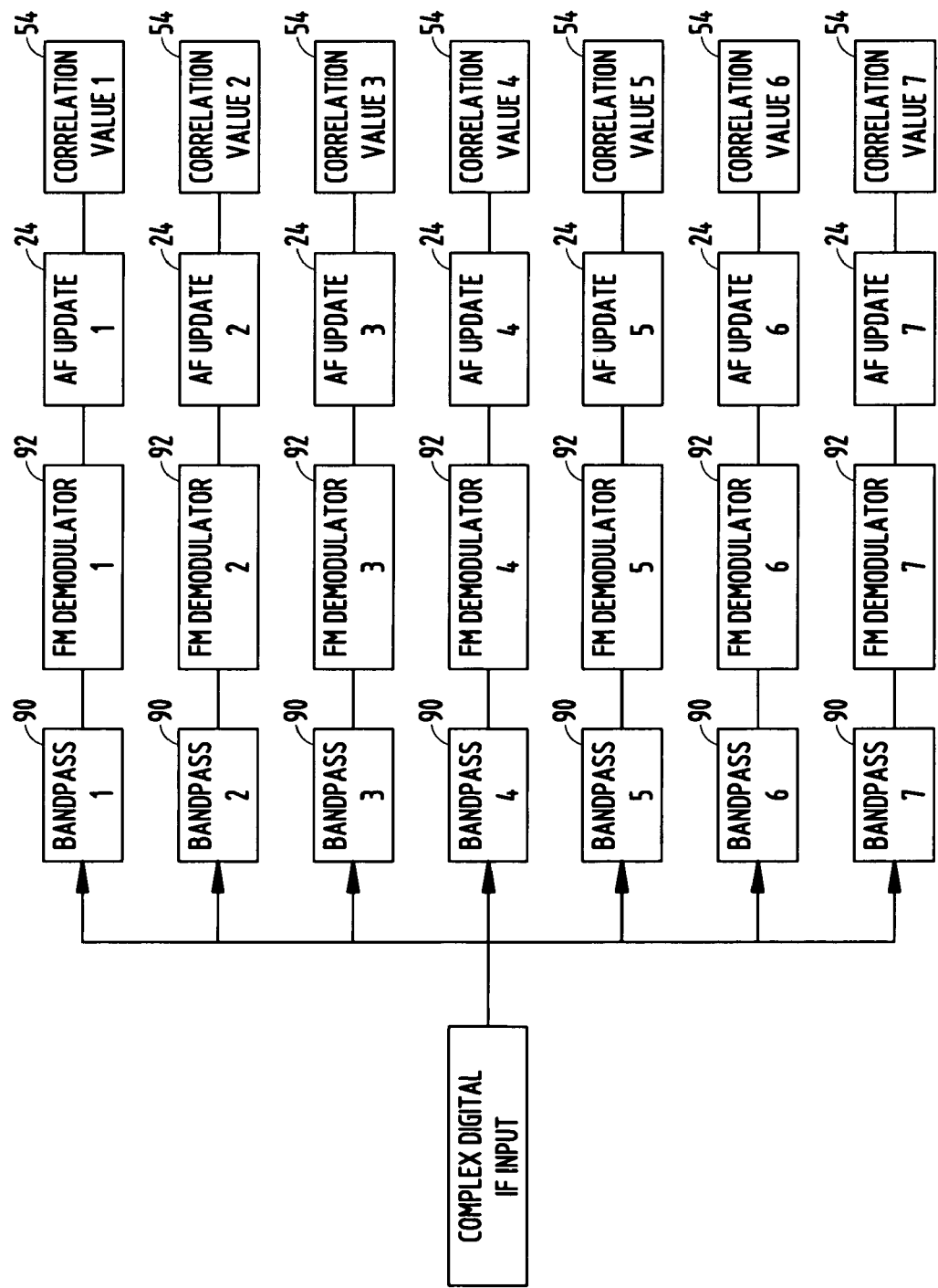
FIG. 5 is a block diagram illustrating the simultaneous processing of multiple channels of the weather radio band, according to one embodiment of the present invention.
Figure 6:
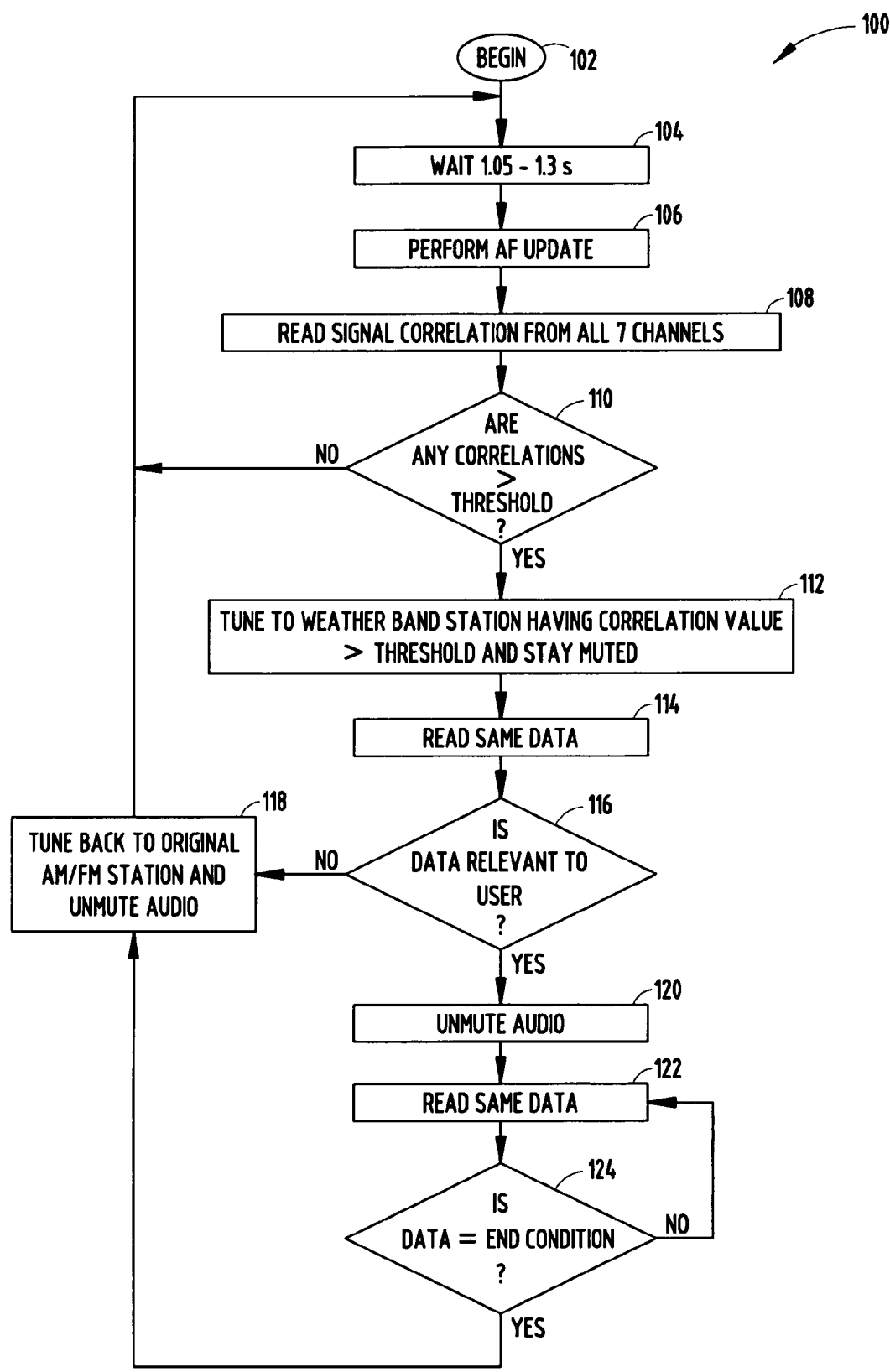
FIG. 6 is a flow diagram illustrating a weather band alert monitoring routine, according to another embodiment of the present invention.

According to one embodiment of the present invention, the RF radio 10 executes the weather band alert monitoring routine 100 shown in FIG. 6 to monitor a plurality of weather band stations simultaneously with the use of an AF update. In one exemplary embodiment, the RF radio 10 monitors the seven currently existing weather band channels at seven distinct frequencies during a single AF update process. In doing so, the output of the analog-to-digital converter 18 is provided as a complex digital IF input to the digital signal processor 20. The digital signal processor 20 executes a bandpass filter 90, FM demodulator 92 and AF update 24 for each channel of the plurality of weather band stations and generates corresponding correlation values 54 as shown in FIG. 5. The complex digital IF input is simultaneously input to each of the seven bandpass filters 90, labeled bandpass 1-7. The bandpass filter 90 are digital bandpass filters, according to one embodiment, and may be executed as software by the digital signal processor 20. The seven distinct bandpass filters 90 are used to separate the seven distinct channels of the weather band. According to one example, bandpass filters 1-7 may have respective frequency passbands centered at 162.400 MHz, 162.425 MHz, 162.450 MHz, 162.475 MHz, 162.500 MHz, 162.525 MHz and 162.550 MHz to each pass RF signals at one of the channel frequencies and reject the remaining channel frequencies of the weather band. The individual filtered outputs are input to corresponding FM demodulators 92 to perform a demodulation on each signal. The demodulated output of each of the FM demodulators 92 is filtered and processed by a correlation or AF update routine 24 to generate a corresponding correlation value 54 for each channel of the weather band. Thus, the seven correlation values 54 are representative of the signal monitored at each of the seven weather band channels.

It should be appreciated that the FM radio band and the weather radio band may share an IF signal path and an IF filter which in one embodiment has less than 200 kHz of 3 dB bandwidth, and more typically about 180 kHz of 3 dB bandwidth. When the IF filter is tuned to the center channel in the weather band, e.g., 162.475 MHz, all seven channels in the weather band are present in the bandwidth for processing by the DSP 20. In the DSP 20, the seven separate filters 90 are simultaneously executed in parallel to separate signals in the seven channels. The seven demodulators 92 then demodulate the seven individual filtered outputs, and the AF updates 24 are executed simultaneously during a single AF update process to generate the seven corresponding correlation values 54 for the seven respective channels.

By processing signals in the seven channels of the weather band simultaneously, the RF radio 10 and method 100 advantageously realizes a reduction in required AF updates and the time of the update process to effectively monitor all seven frequencies of the weather band. To ensure that an alert will not be missed, the AF update for simultaneously processing signals in all seven channels is performed once about every 1.4 seconds at a maximum. This eliminates the requirement to perform quicker AF updates sequentially amongst the individual channels which may otherwise cause audible disturbances. By monitoring more than one station, such as all seven weather stations, during a single AF update time period, an AF update need only be performed about once every 1.4 seconds. This reduction in AF updates is advantageous because of the realized reduction of small disturbances created from each AF update and also from electromagnetic interference (EMI) from IIC communication traffic being reduced.

Referring to FIG. 6, the weather band alert monitoring routine 100 is illustrated for monitoring warning alert data broadcast in a radio band of an RF radio to acquire data from multiple channels during a single AF update time, according to one embodiment. Routine 100 begins at step 102 and proceeds to wait for a time period of about 1.05 to 1.30 seconds in step 104. The time period of 1.05 to 1.30 seconds generally establishes a maximum range to ensure that the data is received. Next, in step 106, routine 100 performs an AF update. The AF update 106 is performed simultaneously on each of a plurality of channels of the weather radio band to generate correlation values that correspond to each channel of the weather band. In the embodiment disclosed, seven correlation values are generated for the seven weather band channels.

Proceeding to step 108, the weather band alert monitoring routine 100 reads the signal correlation values for all seven channels of the weather band. The correlation values are indicative of data present on the corresponding channel. In decision step 110, routine 100 determines if any of the correlation values are greater than a threshold value and, if not, returns to step 104. If any of the correlation values are determined to be greater than the threshold value, routine 100 proceeds to tune to the weather band station having a correlation value greater than the threshold value, and further keeps the audio muted. It should be appreciated that if correlation values for multiple channels exceed the threshold value, the tuner may tune to one of the weather band stations that is determined to be more relevant or pertinent to the user, according to one embodiment. For example, the tuner may determine which of a plurality of weather band stations is more pertinent to a user based on a determined location of the user or radio, such as may be provided with the use of a global positioning system (GPS) as disclosed in U.S. Pat. No. 6,728, 522, the entire disclosure of which is incorporated herein by reference. Alternately, routine 100 may tune to weather band stations that each have a correlation value exceeding the threshold, sequentially one station at a time, or at the same time if multiple tuners are available.

Following tuning to the weather band station of step 112, routine 100 proceeds to step 114 to read the SAME data available at the tuned channel, which includes the collection and the processing of the warning alert data. Next, in decision step 116, routine 100 determines if the data is relevant to the user, and if not, proceeds to step 118 to tune back to the original AM/FM station before returning to step 104. In determining if the data is relevant, the routine 100 may look to a condition that may include a specific geographic location defined by the user or obtained by a GPS, or the condition can be a specific type or types of warnings which can be set by the user. If the data is determined to be relevant to the user, such that the SAME data matches a condition, routine 100 proceeds to step 120 to unmute the audio, and then proceeds to step 122 to read the SAME data so the audible portion of the alert can be heard. In decision step 124, routine 100 determines if the data is equal to the end condition indicative of the end of the alert warning data and, if so, proceeds to step 118 to turn back to the original AM/FM radio station and unmutes audio before returning to step 104. It should be appreciated that routine 100 will continue to read the SAME data in step 122 until the end condition of the data is detected in decision step 124. The process 100 is then repeated at step 104.

Accordingly, the weather band alert monitoring routine 100 is thereby able to effectively and efficiently monitor a plurality of weather band channels during a single AF update time. The relevant warning alert data is monitored, collected and made available to a user, without adversely interfering with the receipt and processing of user selected radio band signals. The RF radio 10 and method 30 and 100 of the present invention advantageously monitors an alternate frequency and provides warning alert data made available to a user without interfering with the user's desired radio band frequency selection. The system and method periodically and momentarily monitors the alternate frequency of the weather band to determine the presence of warning alert data and, if present, allows for the receipt and presentation of the data.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An RF radio having a radio band configured to receive warning alert data, said radio comprising:
   a radio receiver for receiving broadcast radio wave signals;
   a single tuner adjustable for selecting radio wave signal channels within a first radio band and radio wave signal channels within a second radio band, wherein the second radio band comprises a plurality of channels adapted to provide warning alert data; and
   a controller for controlling the tuner to select a radio wave signal channel within the first radio band, wherein the controller controls the tuner to periodically switch to a frequency within the second radio band to generate an IF signal comprising warning alert data from the plurality of channels to simultaneously monitor the plurality of channels while the tuner is controlled to the frequency in the second radio band and determine presence of warning alert data on one or more of the plurality of channels in the second radio band, and wherein the controller initiates receipt of the warning alert data when the warning alert data is determined to be present.

2. The radio as defined in claim 1, wherein the second radio band is a weather band.

3. The radio as defined in claim 2, wherein the weather band comprises specific area message encoding (SAME) weather band signals.

4. The radio as defined in claim 2, wherein the weather band comprises seven channels, wherein the controller simultaneously monitors the seven channels for presence of warning alert data.

5. The radio as defined in claim 1, wherein the controller simultaneously monitors a plurality of channels within a bandwidth of less than 200 kHz.

6. The radio as defined in claim 1, wherein the controller periodically tunes the tuner for a momentary time period to check for the presence of warning alert data.

7. The radio as defined in claim 1, wherein the controller performs an alternate frequency update.

8. The radio as defined in claim 7, wherein the alternate frequency update comprises detecting a correlation value for each of the plurality of channels of the second radio band and comparing the correlation value for each of the plurality of channels of the second radio band to a threshold value to determine the presence of warning alert data broadcast in the second radio band.

9. The radio as defined in claim 1, wherein the radio comprises a vehicle radio.

10. The radio as defined in claim 1, wherein the controller further comprises a plurality of bandpass filters, wherein and each bandpass filter is configured to receive the IF signal and separate the warning data associated with each of the plurality of channels from the IF signal.

11. A method of monitoring warning alert data broadcast in a radio band of an RF radio, said method comprising the steps of:
   receiving broadcast radio wave signals with a radio receiver;
   selecting a radio wave signal channel within a first radio band with a single tuner;
   periodically switching the tuner to a second frequency within a second radio band;
   generating an IF signal comprising warning alert data from a plurality of channels within the second radio band;
   simultaneously monitoring a plurality of channels while the tuner is controlled to the frequency in the second radio band;

detecting presence of warning alert data in one or more of the plurality of channels in the second radio band; and initiating receipt of the warning alert data when warning alert data is detected.

12. The method as defined in claim 11, wherein the step of simultaneously monitoring a plurality of channels in the second radio band comprises monitoring seven channels in a weather band.

13. The method as defined in claim 12, wherein the weather band comprises specific area message encoding (SAME) weather band signals.

14. The method as defined in claim 11 further comprising the step of returning the tuner setting to the first radio band after the warning alert data has been received.

15. The method as defined in claim 11 further comprising the step of returning the tuner setting to the first radio band following the periodic switching of the tuner to the second radio band.

16. The method as defined in claim 11, wherein the step of detecting the presence of warning alert data comprises monitoring a correlation value for each of the plurality of channels of the second radio band and comparing the correlation value for each of the plurality of channels of the second radio band to a threshold value to determine whether warning alert data is detected.

17. The method as defined in claim 11, wherein the step of simultaneously monitoring comprises monitoring the plurality of channels within a bandwidth of less than 200 kHz.

18. The method as defined in claim 11, wherein the method is performed on an RF radio in a vehicle.

19. The method as defined in claim 11, wherein the step of simultaneously monitoring a plurality of channels while the tuner is controlled to the frequency in the second radio band includes filtering the IF signal with a plurality of bandpass filters, wherein each bandpass filter is configured to receive the IF signal and separate the warning data associated with each of the plurality of channels from the IF signal.

* * * * *